(12) United States Patent
Nguyen

(10) Patent No.: US 7,642,831 B2
(45) Date of Patent: Jan. 5, 2010

(54) PHASE SHIFT CIRCUIT WITH LOWER INTRINSIC DELAY

(75) Inventor: Andy Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 113 days.

(21) Appl. No.: 11/880,577

(22) Filed: Jul. 23, 2007

(65) Prior Publication Data

US 2009/0027098 A1    Jan. 29, 2009

(51) Int. Cl.
*H03K 3/00* (2006.01)
(52) U.S. Cl. .................. 327/231; 327/149; 327/158; 327/254; 327/263
(58) Field of Classification Search .............. 327/149, 327/158, 231–233, 236, 238–239, 254–257, 327/263
See application file for complete search history.

(56) References Cited

U.S. PATENT DOCUMENTS 5,661,427 A * 8/1997 McBride et al. ............. 327/236

2003/0101376 A1 * 5/2003 Sanghani ....................... 714/30
2006/0232314 A1 * 10/2006 Hatani et al. ................ 327/231

* cited by examiner

*Primary Examiner*—Long Nguyen
*Assistant Examiner*—Shikha Goyal
(74) *Attorney, Agent, or Firm*—Mauriel Kapouytian & Treffert LLP; Ararat Kapouytian

(57) ABSTRACT

A phase shift circuit that includes two, rather than four, delay chains and corresponding selectors is described. This provides a significant area savings and reduces the intrinsic delay of the phase shift circuit, which is particularly beneficial for embodiments in which there is no intrinsic delay matching. In one implementation, the phase shift circuit includes a first delay circuit and a matching delay circuit. The first delay circuit provides a first delay that includes a first intrinsic delay and a first intentional delay. The delay matching circuit provides a matching delay that matches the first intrinsic delay. In one implementation, the phase shift circuit also includes a second delay circuit to provide a second delay that includes a second intrinsic delay and second intentional delay, where the second intrinsic delay matches the first intrinsic delay and the second intentional delay is half as long as the first intentional delay.

24 Claims, 10 Drawing Sheets

PHASE SHIFT CIRCUIT WITH LOWER INTRINSIC DELAY

BACKGROUND

The present invention relates to phase shift circuits.

One simple method of providing a phase shifted signal is to include a delay element in a clock signal path. Disadvantages of this simple approach include the following: (1) it provides the desired phase shift for only a specific input clock frequency, (2) it has wide variation across process, voltage, and temperature (PVT), and (3) it requires testing/characterization in the production flow, i.e., during the manufacturing process, to determine if the phase shift is within an acceptable range.

A second method of generating a phase shifted signal is to use a phase-locked loop (PLL) circuit. In one PLL circuit, OSC, the output of the voltage controlled oscillator (VCO), is provided to a divide-by-2 circuit. The output of the divide-by-2 circuit, OSC1/2, which has a frequency that is half that of OSC, is then provided to the phase frequency detector (PFD). OSC is also sent to a negative edge-triggered divide-by-2 circuit. When the VCO is locked, the output of the negative edge-triggered divide-by-2 circuit is CLK90, which is CLKIN phase shifted by 90 degrees. Disadvantages of this method include (1) relatively low yield, (2) need for testing in production, (3) difficultly to migrate as semiconductor process scales are reduced, (4) susceptibility to power and ground noises, and (5) locking difficulties.

A third method of generating a phase shifted signal is to use a delay-locked loop (DLL) circuit. FIG. 1 is a block diagram illustrating a DLL circuit that provides phase shifted signals. In FIG. 1, DLL circuit 100 includes four delay chains 110, 120, 130, and 140 with four corresponding multiplexors 115, 125, 135, and 145. Each of the first through fourth delay chains is a ¼ T N-tap delay chain, where T is the period of an input clock signal CLKIN 101 and N is an integer. Each delay chain includes N delay units, whose collective delay is ¼ T, where each delay unit produces a delay of T/(4N). Each delay chain provides its N delayed outputs to its respective multiplexor, where the delay of the first output is 0 and increases by T/(4N) for each consecutive output. Each of multiplexors 115, 125, 135, and 145 is an N by 1 multiplexor.

First delay chain 110 receives input clock signal CLKIN 101 and provides N delayed signals to first multiplexor 115. Output 116 (also referred to as CLK90) of first multiplexor 115 is input to second delay chain 120. Second delay chain 120 provides N delayed signals to second multiplexor 125. Output 126 (also referred to as CLK180) of second multiplexor 125 is input to third delay chain 130. Third delay chain 130 provides N delayed signals to third multiplexor 135. Output 136 (also referred to as CLK270) of third multiplexor 135 is input to fourth delay chain 140. Fourth delay chain 140 provides N delayed signals to fourth multiplexor 145. Output 146 (also referred to as CLK360) of fourth multiplexor 145 is sent to phase detector 160.

Phase detector 160 also receives CLKIN. Phase detector 160 provides information regarding the phase difference between CLKIN and CLK360 to control circuit 170. If CLKIN is not in phase with CLK360, then control circuit 170 will send control signal 171 to the first through fourth multiplexors to select the next delayed output from their respective delay chains such that all four multiplexors advance together. When CLKIN and CLK360 are in phase, control circuit 170 will send control signal 171 to the first through fourth multiplexors to maintain their current selections. Thus, the DLL is locked at the selected delays. When the DLL is locked, CLK90, CLK180, CLK270, and CLK360 are respectively 90, 180, 270, and 360 degrees phase shifted with respect to CLKIN.

If as a result of input clock frequency change or PVT variation, CLK360 is no longer in phase with CLKIN, then control circuit 170 will signal the first through fourth multiplexors to select the next or previous delayed output from their respective delay chains such that all four multiplexors advance or retreat together. This process will continue until CLKIN and CLK360 are in phase again and the DLL is relocked.

DLL circuit 100 provides a number of advantages with respect to one or both of the two other options described above. First, it can be a 100% digital and therefore provides higher yield than a circuit that is less than 100% digital. It is simple to implement and, thus, can be implemented relatively quickly with relatively limited resources. Its simple implementation guarantees locking and relocking without testing in production because it includes a control circuit. It also has the advantages of ease of migration as semiconductor manufacturing processes advance, working with any power supply level, having less clock jitter, and being less susceptible to power noise level.

Despite the above advantages, the DLL circuit also has the following disadvantages. First, it requires a relatively large amount of area. Each of the four delay chains requires a large area. Similarly, each of the four multiplexors also requires a large area, especially since the paths for all the multiplexor inputs are matched. Second, the delay chains, if long, may require a significant amount of power. Third, the intrinsic delay of the first through fourth multiplexors limit the maximum frequency Fmax of the input clock signal CLKIN. The intrinsic delay increases with a lower CLKIN frequency as that requires a longer delay chain, which in turn requires a larger multiplexor. Thus, a lower CLKIN Fmin (minimum CLKIN frequency) specification results in a lower CLKIN Fmax. To compensate for the limitation on Fmax by the intrinsic delay, some DLL circuits offer only two phases (e.g., 0 and 180 degrees) in high frequency mode (i.e., when the frequency of CLKIN is high) rather than the four phases (e.g., 0, 90, 180, and 270 degrees) offered in low frequency mode (i.e., when the frequency of CLKIN is low). Reducing the number of phases offered allows for increasing Fmax because in that case some multiplexors are bypassed thus removing their intrinsic delay and reducing the overall intrinsic delay. However, this approach to compensate for limitations on Fmax does so at the expense of eliminating previously offered phase shifts. Moreover, it fails to address all the disadvantages mentioned above.

SUMMARY

In one aspect, an embodiment of the present invention provides a phase shift circuit that includes two, rather than four, delay chains and corresponding selectors. This provides a significant area savings in comparison to the above described DLL phase shift circuit that includes four delay chains. It also reduces the intrinsic delay of the phase shift circuit, which is particularly beneficial for embodiments in which there is no intrinsic delay matching.

In addition to the two delay chains and their corresponding selectors, an embodiment of the present invention also includes matching delay selectors. The matching delay selectors match the intrinsic delays of the selectors that select delayed outputs of the delay chains. Matching the selector delays allows for comparing the output of the delay chains against a delayed version of the input signal, rather than the input signal. This delayed version of the input signal may herein be referred to as the reference signal. As a result, Fmax, the maximum frequency of the input signal at which the phase shift circuit may operate, is not limited by the intrinsic delays or by Fmin, the minimum frequency of the input signal at which the phase shift circuit may operate.

In another aspect, in addition to the two delays chains, their corresponding selectors, and the matching delay selectors, an embodiment of the present invention includes a delay circuit that both matches the intrinsic delays of the corresponding selectors and provides a delay that is half that provided by the two delay chains. This delay circuit may be used to provide a phase shifted signal whose delay with respect to the reference signal is half that of another phase shifted signal that may be provided using the two delay chains and their corresponding selectors.

In one embodiment, when the input signal has a duty cycle of fifty percent, the above embodiment of the present invention can be used to provide a 90 degree phase shift with respect to the reference signal.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 2:
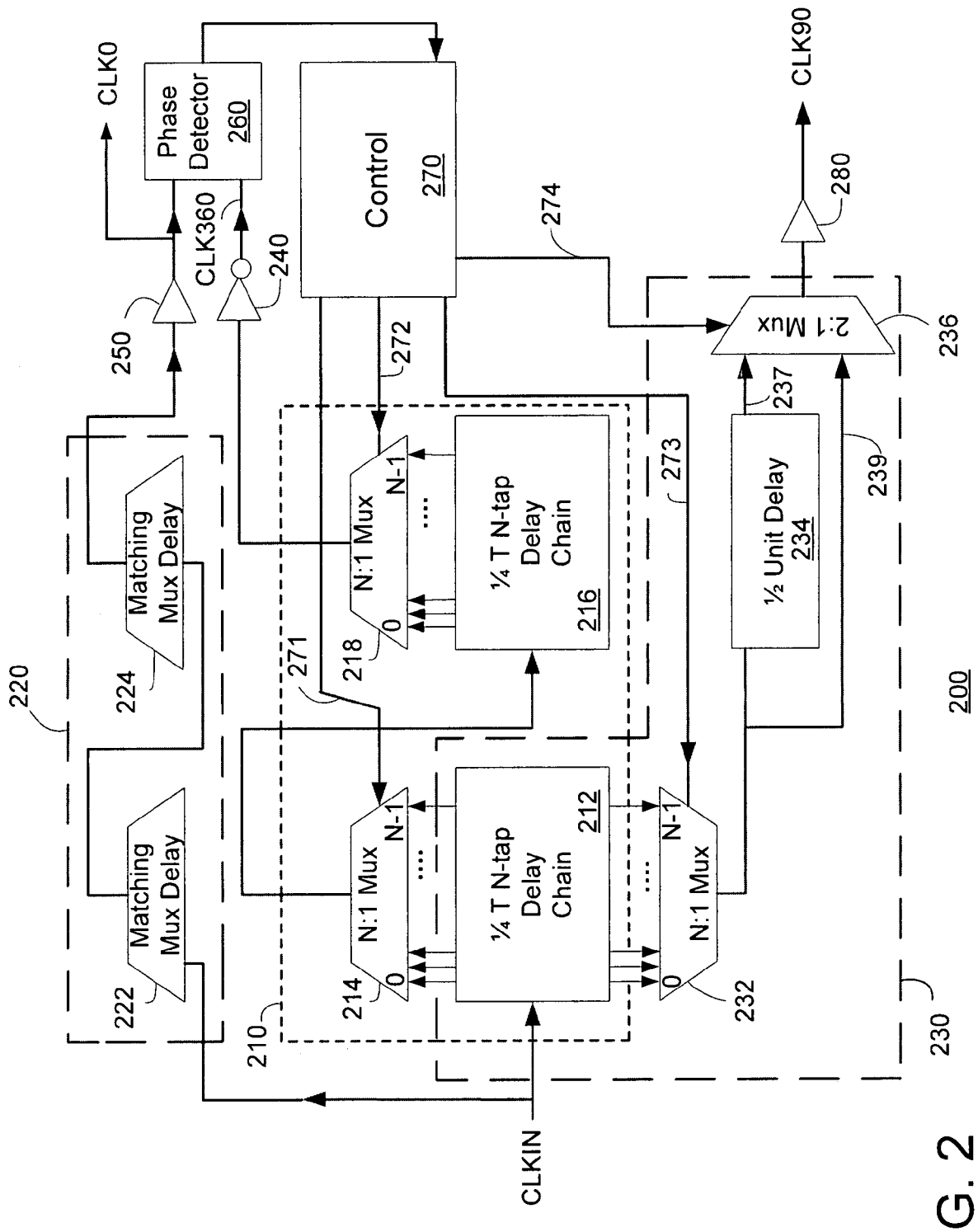
FIG. 2 is a block diagram of one embodiment of the phase shift circuit of the present invention.

FIG. 2 is a block diagram of one embodiment of the phase shift circuit of the present invention. Phased shift circuit 200 includes first delay circuit 210, matching delay circuit 220, second delay circuit 230, inverter 240, buffer 250, phase detector 260, control circuit 270, and buffer 280.

First delay circuit 210 includes first delay chain 212, first selector 214, second delay chain 216, and second selector 218. Matching delay circuit 220 includes first matching delay selector 222 and second matching delay selector 224. Second delay circuit 230 includes first delay chain 212, third selector 232, half unit delay element 234, and fourth selector 236.

In one embodiment, first delay chain 212 is a ¼ T N-tap delay chain, where T is the period of the input clock signal CLKIN and N is an integer. In one embodiment, first delay chain 212 includes 2N inverters or buffers whose collective delay is ¼ T, where the delay of each pair of inverters or buffers is T/(4N). In this embodiment, each pair of inverters or buffers constitutes a unit of first delay chain 212. Each unit produces a unit delay of T/(4N). In another embodiment, first delay chain 212 includes N buffers whose collective delay is ¼ T, where the delay of each buffer is T/(4N). In this embodiment, each buffer constitutes a unit of first delay chain 212. Each unit produces a unit delay of T/(4N). First delay chain 212 produces N delayed outputs, where the delay of the first output is 0 and increases by T/(4N) for each consecutive output. The N delayed outputs from first delay chain 212 are provided to first selector 214. In one embodiment, first selector 214 is an N by 1 multiplexor.

Similarly, in one embodiment, second delay chain 216 is a ¼ T N-tap delay chain. In one embodiment, second delay chain 216 includes 2N inverters or buffers whose collective delay is ¼ T, where the delay of each pair of inverters or buffers is T/(4N). In another embodiment, second delay chain 216 includes N buffers whose collective delay is ¼ T, where the delay of each buffer is T/(4N). Second delay chain 216 produces N delayed outputs, where the delay of the first output is 0 and increases by T/(4N) for each consecutive output. The N delayed outputs from second delay chain 216 are provided to second selector 218. In one embodiment, second selector 218 is an N by 1 multiplexor.

As noted above, matching delay circuit 220 includes first matching delay selector 222 and second matching delay selector 224. In one embodiment, first matching delay selector 222 is a multiplexor whose delay matches that of first selector 214. Also in that embodiment, second matching delay selector 224 is a multiplexor whose delay matches that of second selector 218. Thus, the delay of matching delay circuit 220 is intended to match the collective delay of first selector 214 and second selector 218.

The delay of first selector 214 may herein be referred to as the first selector intrinsic delay. Similarly, the delay of second selector 218 may herein be referred to as the second selector intrinsic delay. The first selector intrinsic delay and the second selector intrinsic delay may herein be collectively referred to as the intrinsic delay of first delay circuit 210. On the other hand, the delay of first delay chain 212 may herein be referred to as the first delay chain intentional delay. Similarly, the delay of second delay chain 216 may herein be referred to as the second delay chain intentional delay. The first delay chain intentional delay and the second delay chain intentional delay may herein be collectively referred to as the intentional delay of first delay circuit 210. In one embodiment, matching delay circuit 220 matches the intrinsic delay of first delay circuit 210, i.e., the first selector intrinsic delay and the second selector intrinsic delay.

The output of second matching delay selector 224 is input to buffer 250. The output of buffer 250 is CLK0, which is phase shifted with respect to the input signal CLKIN by the delays of first matching delay selector 222, second matching delay selector 224, and buffer 250.

The output of second selector 218 is input to inverter 240. In one embodiment, the intrinsic delay of inverter 240 is equal to that of buffer 250. The purpose of inverter 240 is to invert its input signal and provide its output to phase detector 260. In one embodiment, as explained below, when CLKIN has a duty cycle of 50 percent, the output of inverter 240 is CLK360, which is CLK0 phase shifted by 360 degrees. Also, as explained below, in that embodiment, the output of second selector 218 is CLK180, which is CLK0 phase shifted by 180 degrees.

As also noted above, second delay circuit 230 includes first delay chain 212, third selector 232, half unit delay element 234, and fourth selector 236. The N delayed outputs from first delay chain 212 are input to third selector 232. In one embodiment, there are two separate sets of N taps that are fed from first delay chain 212 to first selector 214 and third selector 232. In another embodiment, there is one set of N taps that is fed from first delay chain 212 to both first selector 214 and third selector 232. In one embodiment, third selector 232 is an N by 1 multiplexor. Third selector 232 selects one of its input signals and provides the selected signal to half unit delay element 234 and fourth selector 236. Half unit delay element 234 is a delay unit whose delay is equal T/(8N), i.e., half the delay difference between two consecutive taps of first delay chain 212. In other words, the unit delay is the delay produced by one unit of first delay chain 212. As noted above, a unit delay is T/(4N). In one embodiment, half unit delay element 234 includes a pair of inverters or buffers. In another embodiment, half unit delay element 234 includes one buffer. Half unit delay element 234 adds a half unit delay to the input signal it receives from third selector 232. In one embodiment, fourth selector 236 is a 2 by 1 multiplexor and selects between the outputs of third selector 232 and half unit delay element 234.

The collective delay of third selector 232 and fourth selector 236 is herein referred to as the intrinsic delay of second delay circuit 230. On the other hand, the collective delay of first delay chain 212 and half unit delay element 234 is herein referred to as the intentional delay of second delay circuit 230. In one embodiment, the intrinsic delay of second delay circuit 230, i.e., the intrinsic delays of third selector 232 and fourth selector 236, matches the intrinsic delay of first delay circuit 210, i.e., the intrinsic delays of first selector 214 and second selector 218. More specifically, in one embodiment, the intrinsic delay of third selector 232 matches the intrinsic delay of first selector 214, while the intrinsic delay of fourth selector 236 matches the intrinsic delay of second selector 218.

The output of fourth selector 236 is input to buffer 280. In one embodiment, the intrinsic delay of buffer 280 matches the intrinsic delay of inverter 240. In one embodiment, the output of buffer 280 has a delay relative to CLK0 that is equal to half the delay of the output of inverter 240 relative to CLK0. In other words, the combined intrinsic delay of second delay circuit 230 and buffer 280 is equal to the combined intrinsic delay of first delay circuit 210 and inverter 240, while the intentional delay of second delay circuit 230 is half the intentional delay of first delay circuit 210. In one embodiment, as explained below, the output of buffer 280 is. CLK90, which is phase shifted by 90 degrees with respect to CLK0.

First delay circuit 210 is described above as including first delay chain 212, first selector 214, second delay chain 216, and second selector 218, but not inverter 240. Similarly, matching delay circuit 220 is described above as including first matching delay selector 222 and second matching delay selector 224, but not buffer 250. Similarly, second delay circuit 230 is described above as including first delay chain 212, third selector 232, half unit delay element 234, and fourth selector 236, but not buffer 280. It is to be noted that first delay circuit 210 may be described as including inverter 240. Similarly, matching delay circuit 220 may be described as including buffer 250. Similarly, second delay circuit 230 may be described as including buffer 280. With these revised description, it may be said that second delay circuit 230 provides an intentional delay that is equal to half the intentional delay provided by first delay circuit 210. It may also be said that the intrinsic delay of second delay circuit 230 matches that of first delay circuit 210. It may also be said that matching delay circuit 220 provides a delay that is equal to the combined delay of first selector 214, second selector 218, and inverter 240. In other words, matching delay circuit 220 matches the intrinsic delay of first delay circuit 210.

Phase detector 260 receives the outputs of inverter 240 and buffer 250, i.e., CLK360 and CLK0, respectively, and compares their phase difference. Phase detector 260 then provides information regarding the phase difference to control circuit 270. Based on the phase difference, control circuit 270 sends control signals to first selector 214, second selector 218, third selector 232, and fourth selector 236. In response to the control signals received from control circuit 270, first selector 214, second selector 218, third selector 232, and fourth selector 236 select one of their respective inputs. This is explained in more detail below.

When CLK360 is out of phase with CLK0, control circuit 270 sends control signals 271 and 272 to first selector 214 and second selector 218, respectively, such that only one of first selector 214 and second selector 218 advances by one unit. In other words, only one of first selector 214 and second selector 218 is signaled to select the next output signal from first delay chain 212 and second delay chain 216, respectively. In one embodiment, if the previous control signals 271 and 272 were such that second selector 218 selected a delayed output from second delay chain 216 that has the same delay as the delayed output selected by first selector 214 from first delay chain 212, then control circuit 270 will signal first selector 214 to advance its selection by one delay unit and second selector 218 to maintain its previous selection. Also, in one embodiment, if the previous control signals 271 and 272 were such that second selector 218 selected a delayed output from second delay chain 216 that has one unit delay less than the delayed output selected by first selector 214 from first delay chain 212, then control circuit 270 will signal first selector 214 to maintain the same selection and second selector 218 to advance its selection by one delay unit.

In the above embodiment, when first selector 214 is signaled to advance its selection by one delay unit, control circuit 270 sends control signal 273 to third selector 232 to maintain its previous selection and control signal 274 to fourth selector 236 to select input 237, the input from half unit delay element 234, rather than input 239, the input that bypasses half unit delay element 234. Also in the above embodiment, when second selector 218 is signaled to advance its selection by one delay unit, control circuit 270 sends control signal 273 to third selector 232 to advance its selection by one delay unit and control signal 274 to fourth selector 236 to select input 239, the input that bypasses half unit delay element 234, rather than input 237, the input from half unit delay element 234. Thus, control circuit 270 sends signals to first selector 214, second selector 218, third selector 232, and fourth selector 236 such that the intentional delay of second delay circuit 230 is half the intentional delay of first delay circuit 210.

Figure 3:
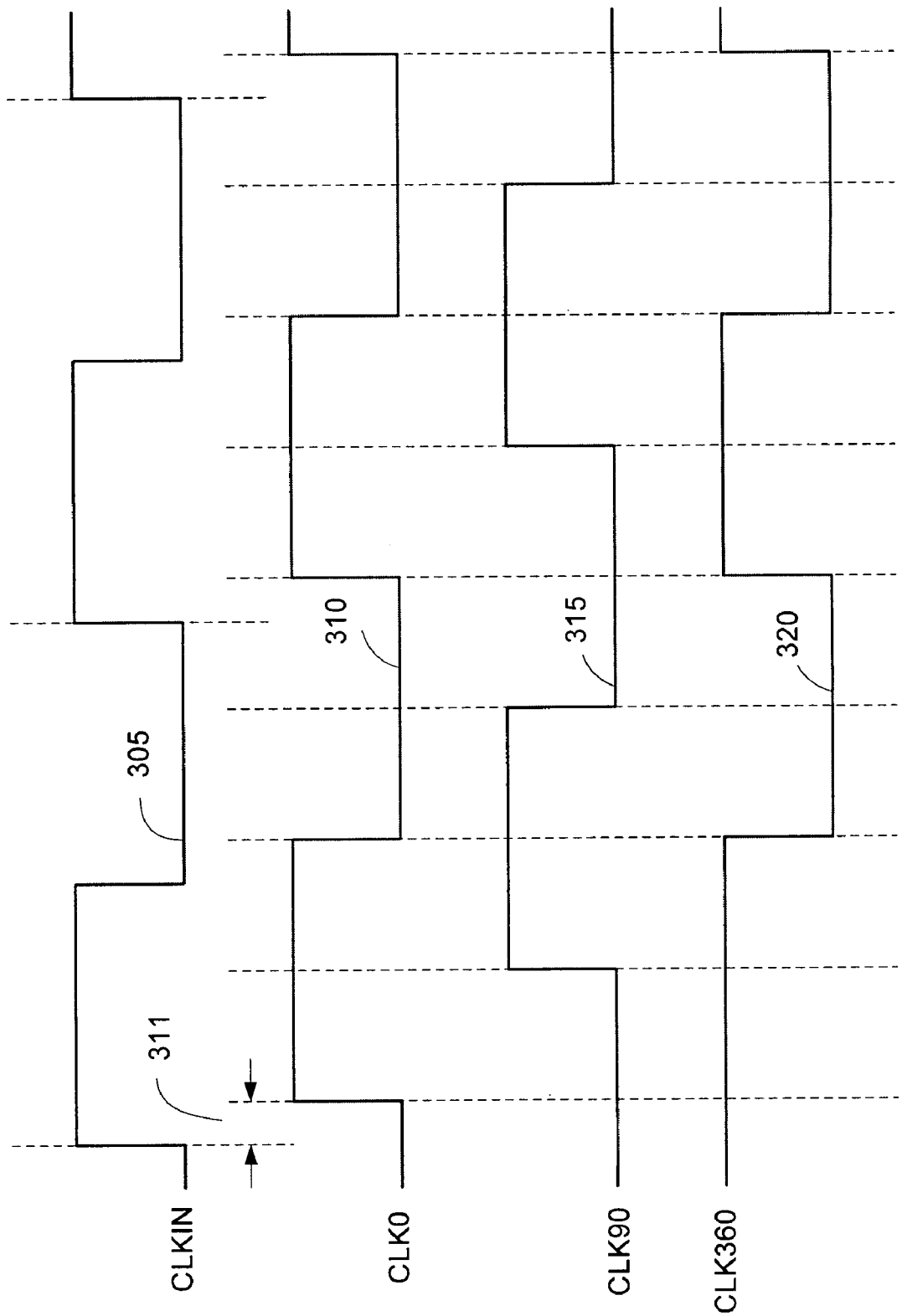
FIG. 3 is an exemplary timing diagram illustrating the relationship between clock signals of the phase shift circuit of FIG. 2.

FIG. 3 is an exemplary timing diagram illustrating the relationship between clock signals of phase shift circuit 200 of FIG. 2. In FIG. 3, signal 310, which represents CLK0, is phase shifted by delay 311, the total delay of first matching delay selector 222, second matching delay selector 224, and buffer 250, with respect to input signal 305, which represents CLKIN. Signal 315, which represents CLK90, is phase shifted by 90 degrees with respect to signal 310, i.e., CLK0. Signal 320, which represents CLK360, is in phase with signal 310, i.e., CLK0. When, as in the case illustrated in FIG. 3, CLK 360 is in phase with CLK0, then control circuit 270 sends control signals to the first through fourth selectors to maintain their previous selections. As a result, the first to fourth selectors maintain their previous selections. In that situation, the DLL of FIG. 2 is locked.

Figure 4:
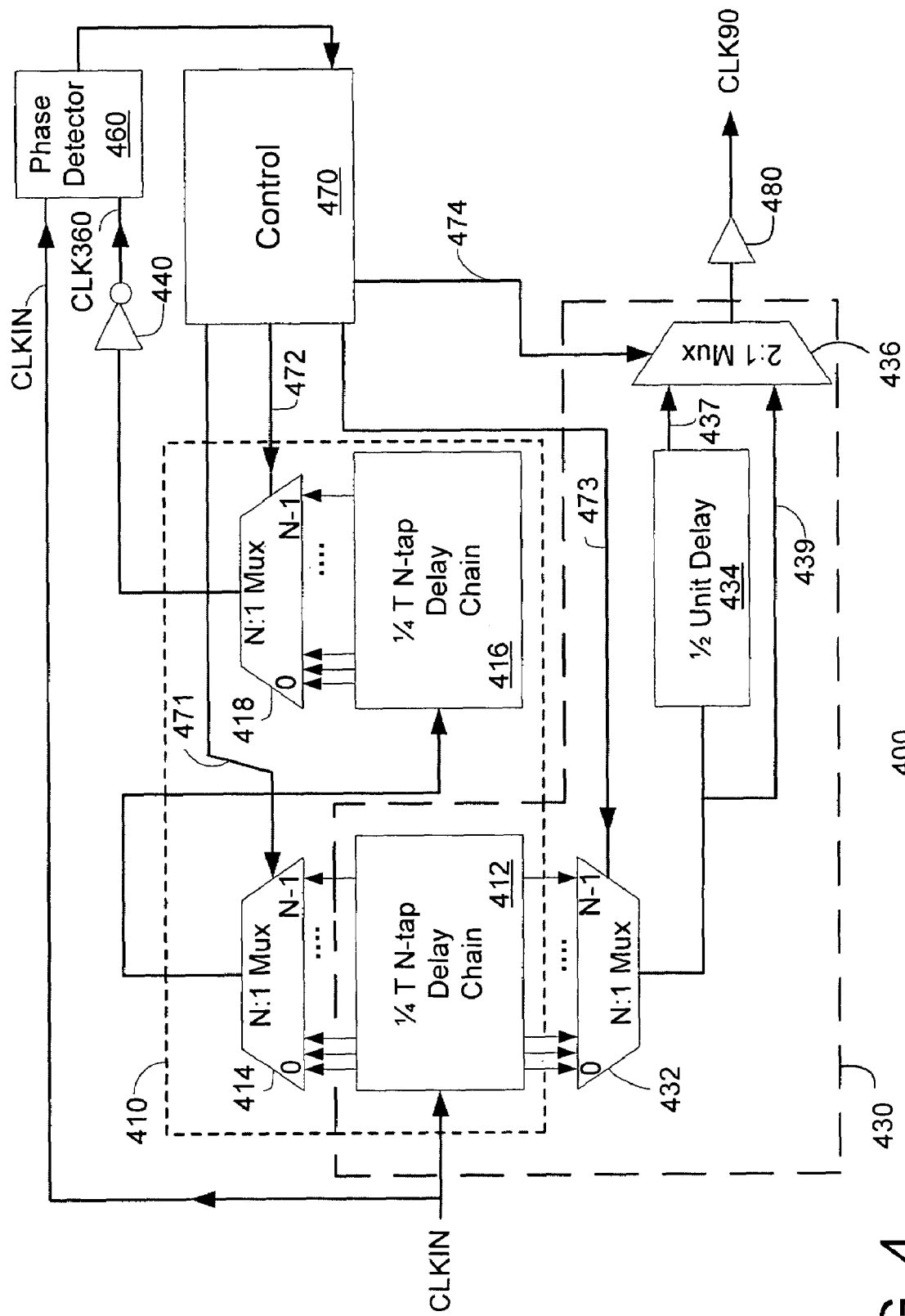
FIG. 4 is a block diagram of another embodiment of the phase shift circuit of the present invention.

FIG. 4 is a block diagram of another embodiment of the phase shift circuit of the present invention. Phased shift circuit 400 includes first delay circuit 410, second delay circuit 430, inverter 440, phase detector 460, and control circuit 470. In one embodiment, phase shift circuit 400 also includes buffer 480 coupled to second delay circuit 430 as shown. First delay circuit 410 includes first delay chain 412, first selector 414, second delay chain 416, and second selector 418. Second delay circuit 430 includes first delay chain 412, third selector 432, half unit delay element 434, and fourth selector 436.

With the exceptions noted below, phase shift circuit 400 is similar to phase shift circuit 200. Components and signals in phase shift circuit 400 that serve similar functions as their counterparts in phase shift circuit 200 have been designated with reference numbers that differ from those of their counterparts by two hundred. For example, control circuit 470 and control signals 471, 472, 473, and 474 in phase shift circuit 400 respectively correspond to control circuit 270 and control signals 271, 272, 273, and 274 in phase shift circuit 200. As phase shift circuit 400 is similar to phase shift circuit 200 and operates in a similar fashion, it will not be described in greater detail here, except to note some of its differences relative to phase shift circuit 200.

Unlike phase shift circuit 200, phase shift circuit 400 does not include a matching delay circuit and a buffer coupled between the matching delay circuit and the phase detector. As a result, phase detector 460 compares the input clock signal CLKIN with CLK360, the output of inverter 240.

Moreover, as phase shift circuit 400 does not include a matching delay circuit, second delay circuit 430 does not match the intrinsic delay of first delay circuit 410. Instead, in an embodiment of phase shift circuit 400 that does not include buffer 480, second delay circuit 430 has an intrinsic delay that is equal to half the intrinsic delay of first delay circuit 410 plus half the intrinsic delay of inverter 440 and an intentional delay that is half the intentional delay of first delay circuit 410. In the embodiment of phase shift circuit 400 that includes buffer 480, the combined intrinsic delay of second delay circuit 430 and buffer 480 is equal to half the combined intrinsic delay of first delay circuit 410 and inverter 440. In other words, CLK90 has an intentional delay and an intrinsic delay that are half as long as the intentional delay and intrinsic delay, respectively, of CLK360.

In one embodiment, the intrinsic delays of inverter 440, buffer 480, and fourth selector 436 are very small, at least relative to the intrinsic delays of first selector 414, second selector 418, and third selector 432. In such a case, the intrinsic delay of inverter 440 makes a very small contribution to the intrinsic delay contained in CLK360. Similarly, the intrinsic delays of buffer 480 and fourth selector 436 make a very small contribution to the intrinsic delay contained in CLK90. As a result, the intrinsic delays of inverter 440, buffer 480, and fourth selector 436 may be ignored without causing the intrinsic delay contained in CLK90 to deviate significantly from being equal to half the intrinsic delay contained in CLK360.

Figure 1:
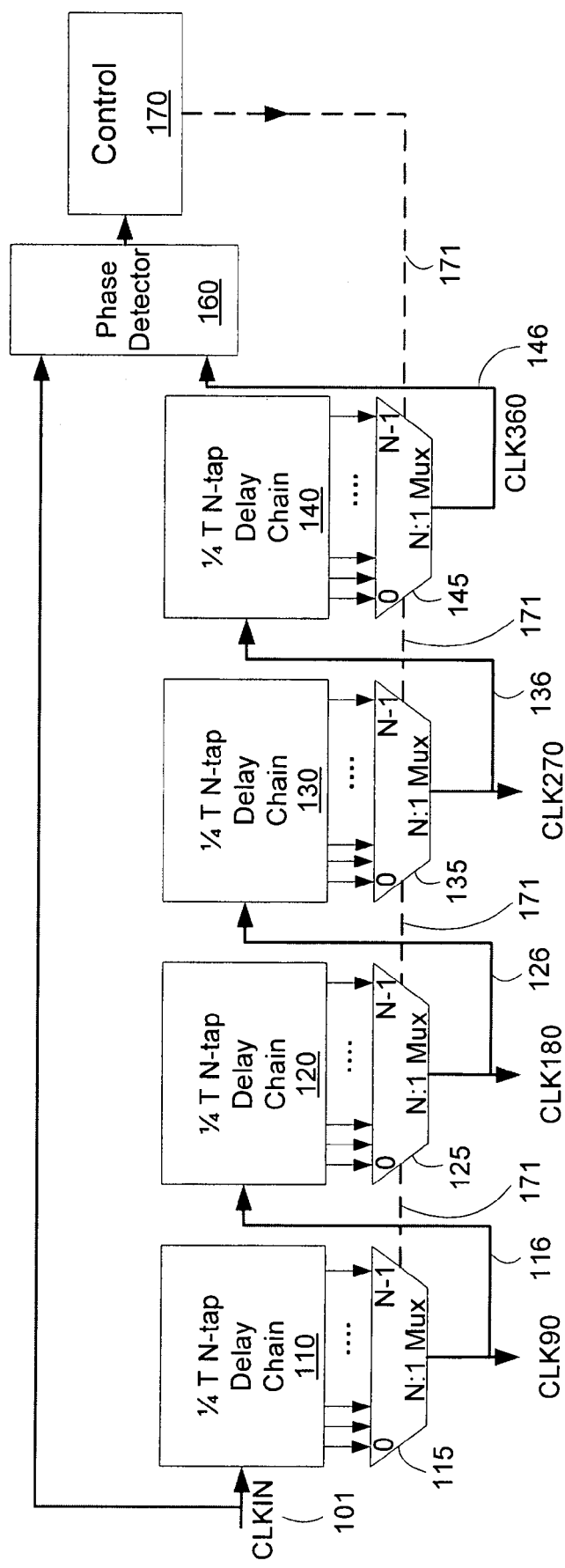
FIG. 1 is a block diagram illustrating a DLL circuit that provides phase shifted signals.

Although phase shift circuit 400 does not provide intrinsic delay matching, it still has advantages relative DLL circuit 100 (shown in FIG. 1). First, it has two delay chains, instead of four. This provides a significant area savings. Second, it has two N:1 selectors, instead of four, in the first delay circuit 410. This also provides a significant area savings. Additionally, it significantly reduces the intrinsic delay of first delay circuit 410.

In one embodiment, as explained below, when CLKIN has a duty cycle of 50 percent, CLK360, the output of inverter 440, is phase shifted by 360 degrees relative to CLKIN. Also, CLK90 is phase shifted by 90 degrees relative to CLKIN. Thus, in one embodiment, using only two delay chains, their corresponding selectors, and an inverter, phase shift circuit 400 is able to produce a signal that is phase shifted by 360 degrees relative to CLKIN. Similarly, a delay chain and a corresponding selector are used to produce a signal that is phase shifted by 90 degrees relative to CLKIN. Phase shift circuit 200 similarly provides signals that are phase shifted by 90 degrees and 360 degrees relative to CLK0.

Figure 5:
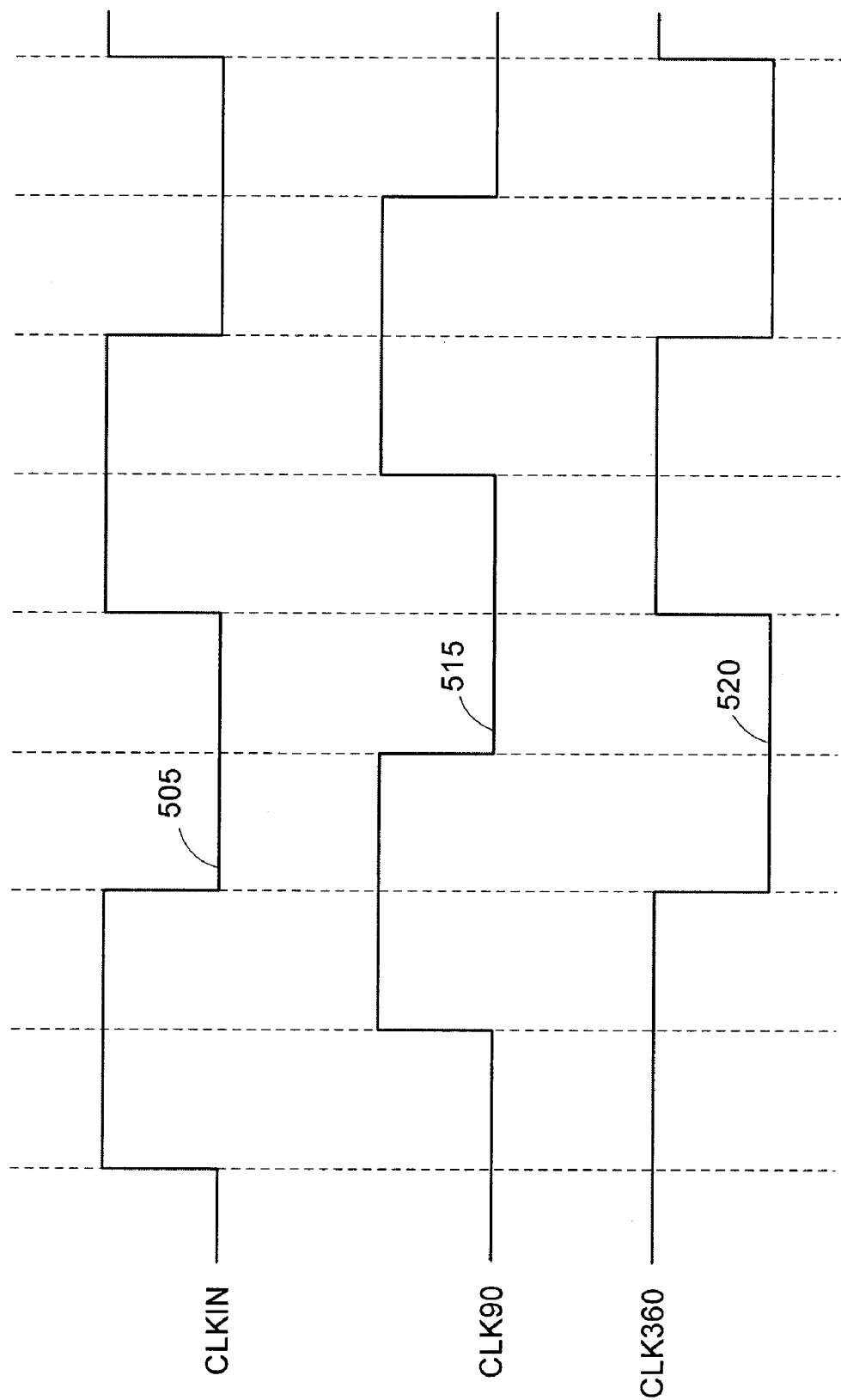
FIG. 5 is an exemplary timing diagram illustrating the relationship between clock signals of the phase shift circuit of FIG. 4.

FIG. 5 is an exemplary timing diagram illustrating the relationship between clock signals of phase shift circuit 400 of FIG. 4. In FIG. 5, signal 505 represents the input clock signal CLKIN. Signal 515, which represents CLK90, is phase shifted by 90 degrees with respect to signal 505, i.e., CLKIN. Signal 520, which represents CLK360, is in phase with signal 505, i.e., CLKIN. When, as in the case illustrated in FIG. 5, CLK 360 is in phase with CLKIN, then control circuit 470 sends control signals to the first through fourth selectors to maintain their previous selections. As a result, the first to fourth selectors maintain their previous selections. In that situation, the DLL of FIG. 4 is locked.

As used herein, 90, 180, 270, and 360 degrees are not limited to exactly 90, 180, 270, and 360 degrees, respectively. Instead, they are respectively meant to also encompass substantially or approximately 90, 180, 270, and 360 degrees, as understood by those skilled in the art.

A phase shift circuit, such as phase shift circuit 200 or 400 of the present invention, has a number of different applications. Below is a brief description of exemplary applications of the phase shift circuit of the present invention.

Figure 6:
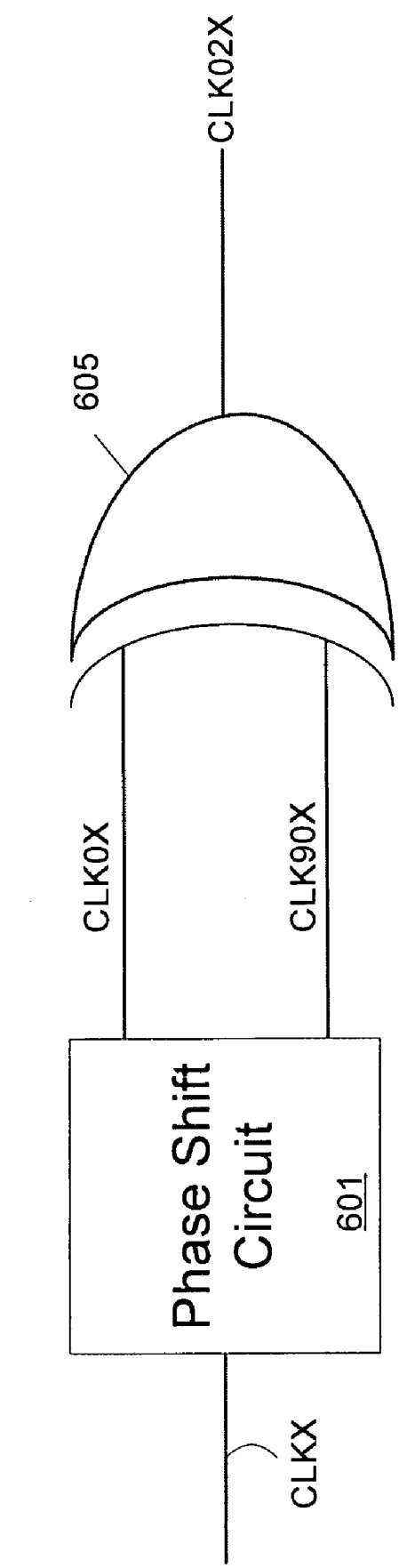
FIG. 6 is a logic circuit diagram illustrating one exemplary application of the phase shift circuit of the present invention.

FIG. 6 is a logic circuit diagram illustrating one exemplary application of an embodiment of the present invention. In FIG. 6, an input clock single CLKX is input to phase shift circuit 601, which may be a phase shift circuit such as phase shift circuit 200 or 400 (shown in detail in FIG. 2 or 4, respectively). Phase shift circuit 601 outputs a reference clock signal CLK0X and a clock signal CLK90X that is phase shifted by 90 degrees with respect to the reference clock signal CLK0X. CLK0X and CLK90X are input to logic device 605 that performs a Boolean XOR operation on its inputs. It is to be noted that CLK0X and CLK90X have the same frequency as the input clock signal CLKX. The output of logic device 605 is CLK02X, which has a frequency that is twice the frequency of CLK0X.

Figure 7:
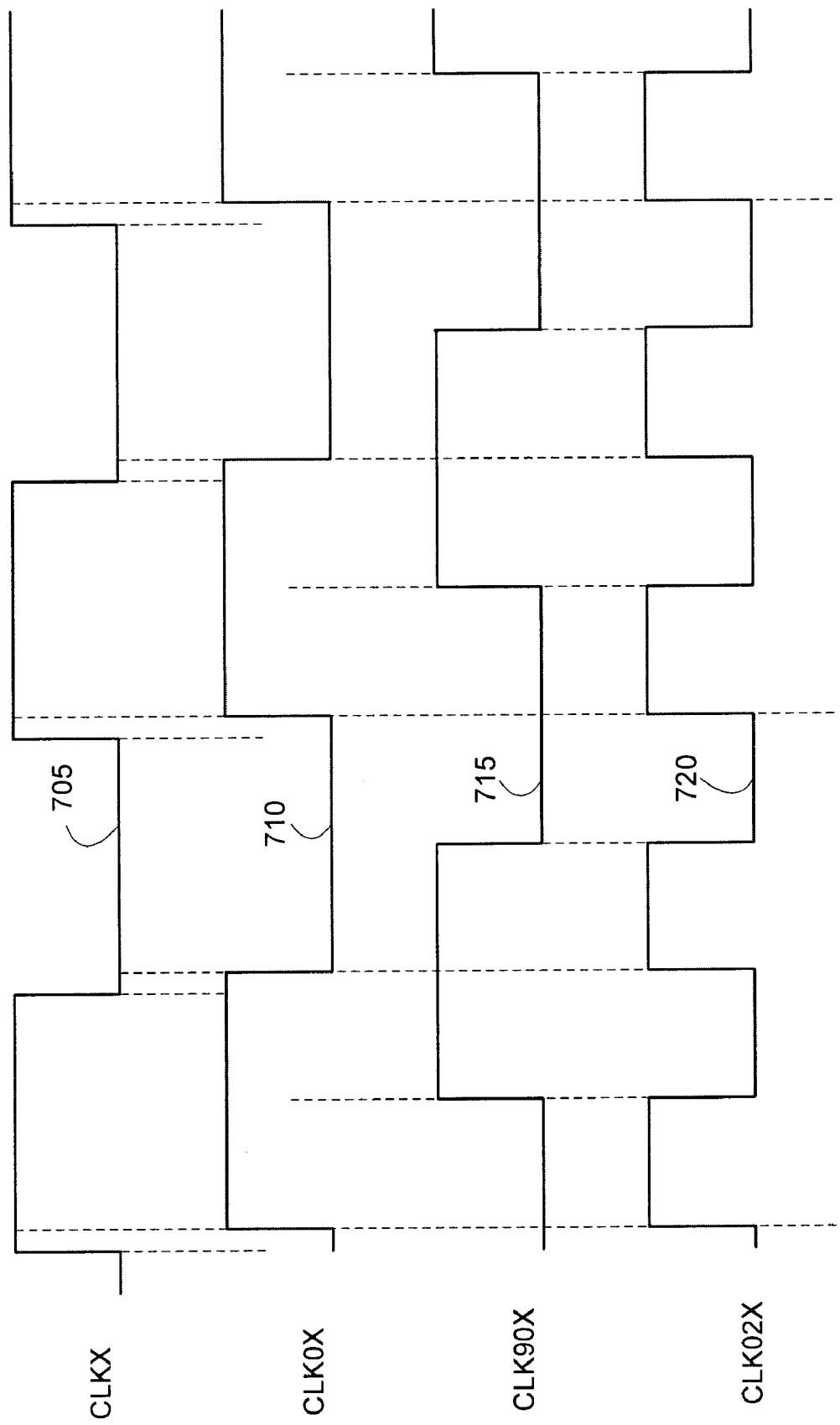
FIG. 7 is a timing diagram illustrating the relationship between relevant signals in FIG. 6.

FIG. 7 is a timing diagram showing the relationship between relevant signals in FIG. 6. In FIG. 7, CLKX, CLK0X, CLK90X, and CLK02X are referenced as 705, 710, 715, and 720, respectively. It is to be noted that when phase shift circuit 601 is one such as phase shift circuit 200, then CLK0X is not in phase with CLKX, as shown in FIG. 7. However, when phase shift circuit 601 is one such as phase shift circuit 400, then CLK0X and CLKX are the same signal and are both represented by CLK0X in FIG. 7. As illustrated in FIGS. 6 and 7, a phase shift circuit of the present invention can be used to generate a clock signal that has twice the frequency of an input signal. Thus, a phase shift circuit of the present invention can be used to double the frequency of an input signal.

Figure 8:
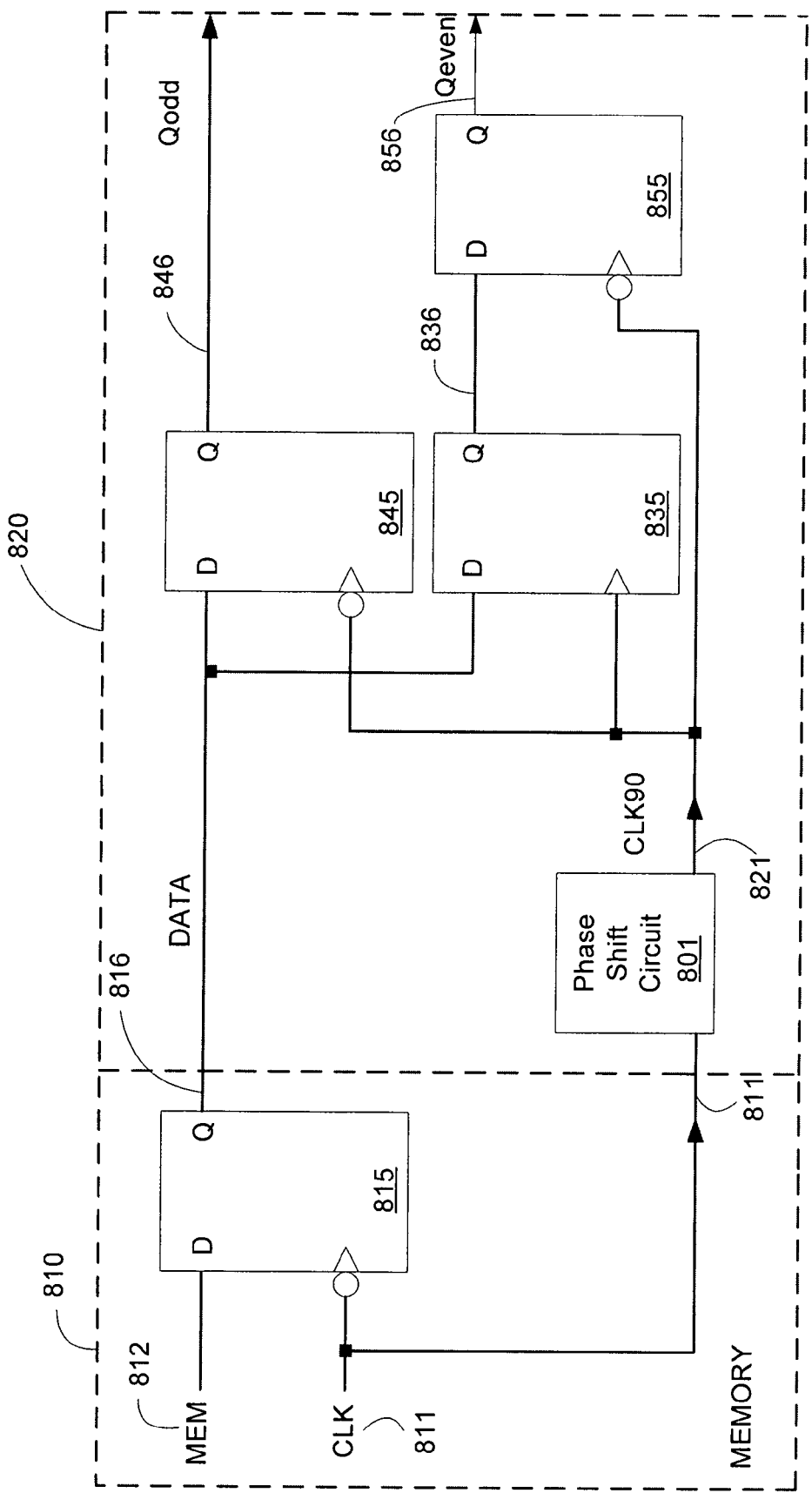
FIG. 8 is a block diagram illustrating a second exemplary application of the phase shift circuit of the present invention.

FIG. 8 is a block diagram illustrating another exemplary application of an embodiment of the present invention. In FIG. 8, memory 810, which includes D-type flip-flop 815, is coupled to memory interface 820. D-type flip-flop 815, a negative edge-triggered flip-flop, receives clock signal CLK 811 and memory data signal 812. Input data signal 816 output from the Q terminal of D-type flip-flop 815 is sent to memory interface 820. Similarly, clock signal CLK 811 is also sent to memory interface 820. D-type flip-flop 815 synchronizes input data signal 816 with clock signal CLK 811.

Memory interface 820 includes phase shift circuit 801, which may be a phase shift circuit such as phase shift circuit 200 or 400 (shown in detail in FIG. 2 or 4, respectively), and D-type flip-flops 835, 845, and 855. D-type flip-flop 835 is a positive edge-triggered flip-flop whereas D-type flip-flops 845 and 855 are negative edge-triggered flip-flops.

Phase shift circuit 801 receives clock signal CLK 811 and outputs phase shifted clock signal CLK90 821, which is 90 degrees phase shifted with respect to clock signal CLK 811. Phase shifted clock signal CLK90 821 is sent to D-type flip-flops 835, 845, and 855. Input data signal 816 is sent to the D terminals of D-type flip-flops 835 and 845. Output 846 of D-type flip-flop 845 is Qodd. Output 836 of D-type flip-flop 835 is sent to the D terminal of D-type flip-flop 855. Output 856 of D-type flip-flop 855 is Qeven.

Figure 9:
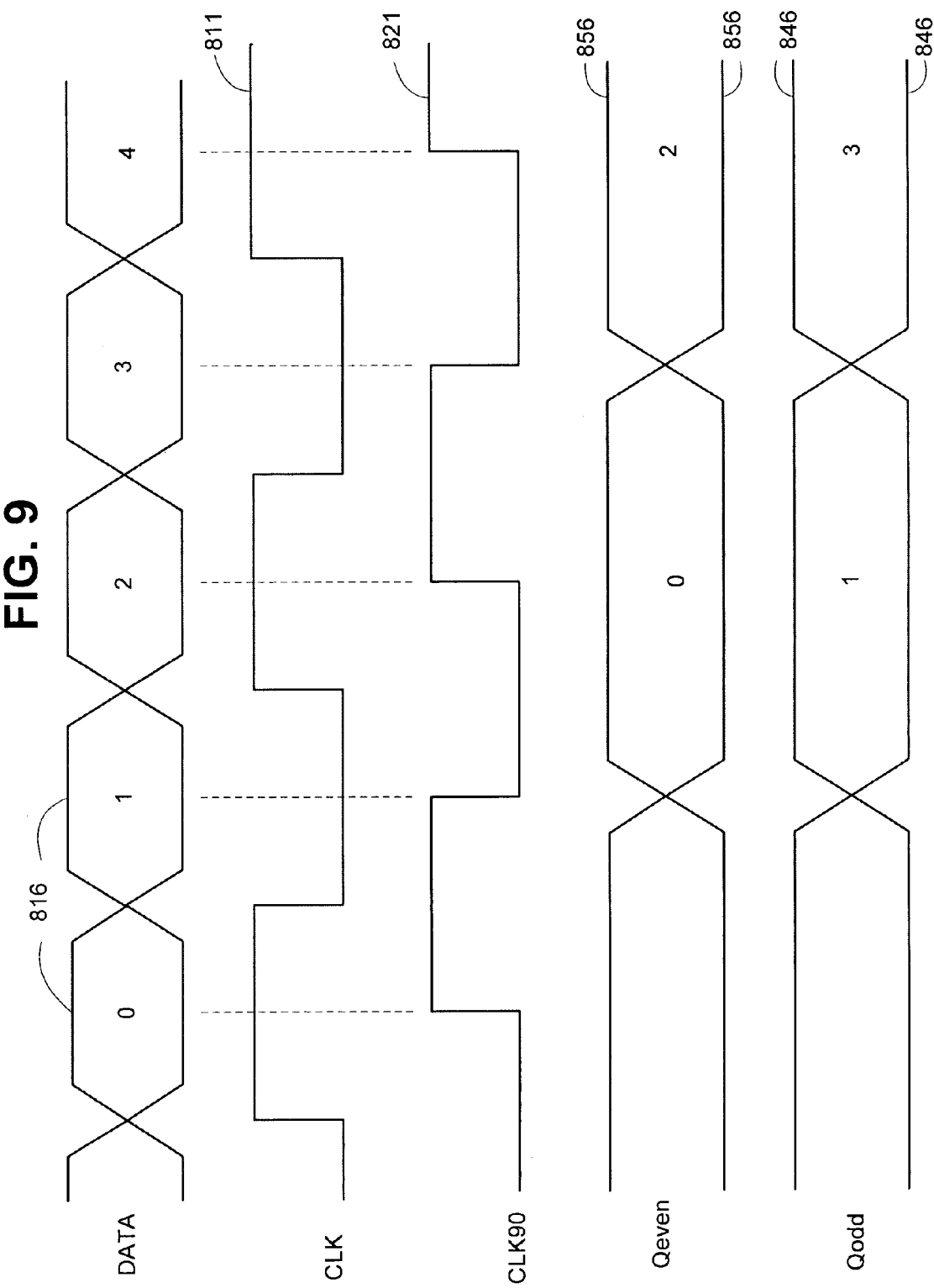
FIG. 9 is a timing diagram illustrating the relationship between relevant signals in FIG. 8.

FIG. 9 is a timing diagram illustrating the relationship between the relevant signals in FIG. 8. In other words, FIG. 9 illustrates the relationship between the following signals: input data signal 816, clock signal CLK 811, phase shifted clock signal CLK90 821, Qodd 846 (the output of D-type flip-flop 845), and Qeven 856 (the output of D-type flip-flop 855).

As can be seen in FIG. 9, transitions of CLK90 occur at midpoints of input data signal 816. As a result, $t_s$ (the setup time) and $t_h$ (the hold time) for clocked devices operating at CLK90, such as D-type flip-flops 835, 845, and 855, can be anything less than $1/4^{th}$ of the CLK period. In other words, D-type flip-flops 835, 845, and 855 can sample data at CLK90 transitions without violating $t_s$ and $t_h$, provided that each of $t_s$ and $t_h$ is less than $1/4^{th}$ of the CLK period. This use of an embodiment of the present invention is useful in many applications, including in circuits that meet double data rate 2 (DDR2) specifications.

Circuits including a phase shift circuit embodying the present invention might be included in a variety of integrated circuits (ICs), including ICs that are programmable logic devices (PLDs). PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

PLDs typically include blocks of memory, each of which in turn typically includes a memory interface. A memory interface generally has a large number of data ports (which are sometimes referred to as DQ ports), e.g., 72 DQ pins, and one or more clock signal ports (which are sometimes referred to as DQS ports). Generally one DQS port is associated with multiple DQ ports, e.g., 4, 8, or 10 DQ ports. It is sometimes preferable that each DQ group have its own DQS. This is, for example, desirable in order to implement data transfers more cost effectively. In a more specific context, it is desirable in order to meet 267 MHz DDR2 specifications or higher DDR2 frequency specifications. The area savings provided by the phase shift circuit of the present invention makes it more practical for each DQS group to have its own phase shift circuit. Thus, the present invention allows implementing data transfers in a more cost effective manner. More specifically, the present invention makes it more practical to meet the 267 MHz DDR2 specifications or higher DDR2 frequency specifications.

In a typical PLD, there are a relatively large number of memory blocks and a correspondingly large number of DQS groups. Thus, use of the present invention in a PLD where each DQS groups has its own phase shift circuit provides significant area savings in comparison to the known DLL described above.

Figure 10:
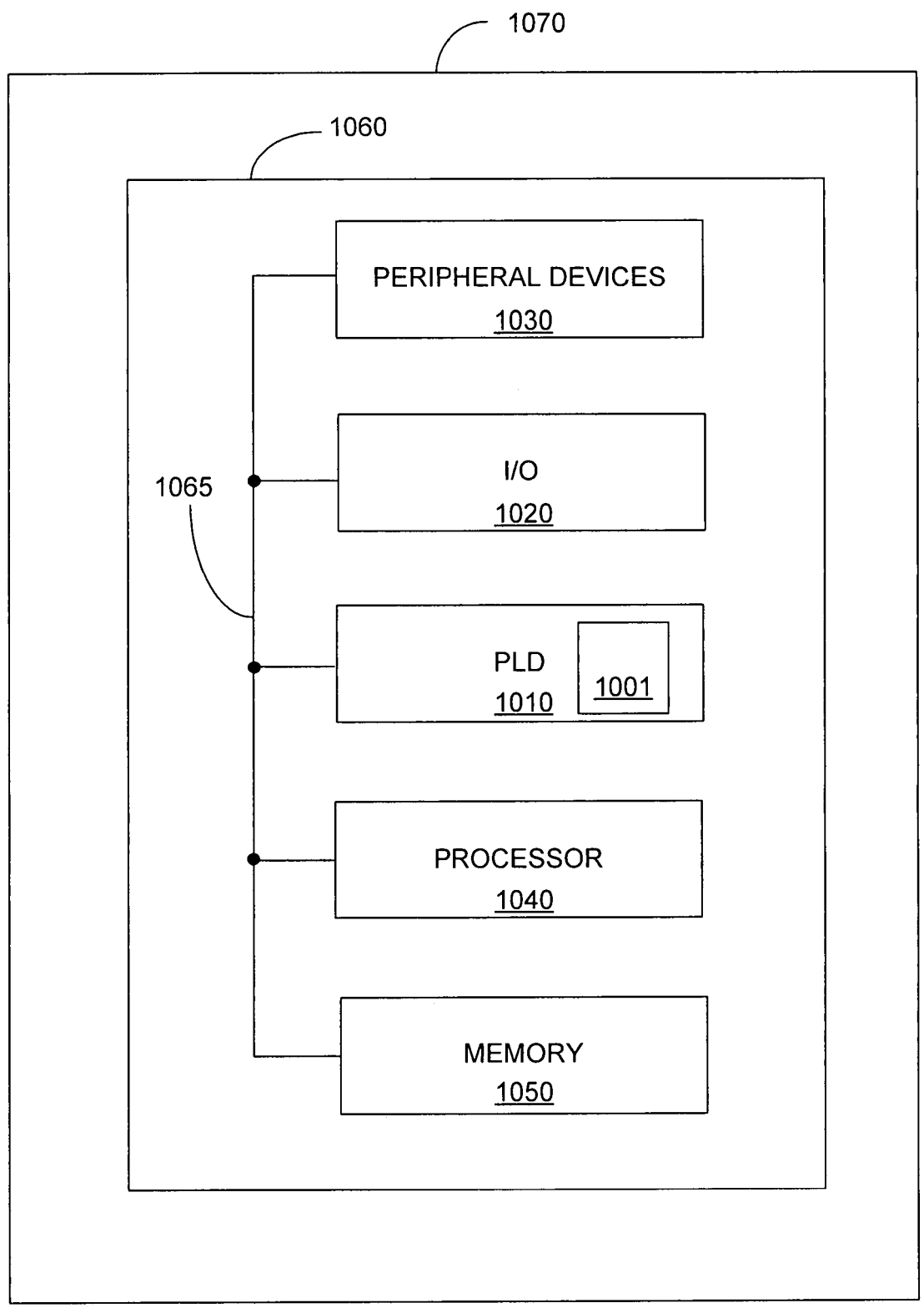
FIG. 10 illustrates an exemplary data processing system including an exemplary programmable logic device in which phase shift circuits in accordance with the present invention might be implemented.

FIG. 10 illustrates, by way of example, PLD 1010 in data processing system 1000. As one example, phase shift circuits of this invention may be implemented in PLDs such as PLD 1010. In one embodiment, phase shift circuit 1001 (such as phase shift circuit 200 or 400, shown in FIG. 2 or 4, respectively) is on the same die/chip as PLD 1010. Data processing system 1000 may include one or more of the following components: processor 1040, memory 1050, input/output (I/O) circuitry 1020, and peripheral devices 1030. These components are coupled together by system bus 1065 and are populated on circuit board 1060 which is contained in end-user system 1070. A data processing system such as system 1000 may include a single end-user system such as end-user system 1070 or may include a plurality of systems working together as a data processing system.

System 1000 can be used in a wide variety of applications, such as computer networking, data networking, instrumentation, video processing, DSP, or any other application where the advantage of using programmable or reprogrammable logic is desirable. PLD 1010 can be used to perform a variety of different logic functions. For example, PLD 1010 can be configured as a processor or controller that works in cooperation with processor 1040 (or, in alternative embodiments, a PLD might itself act as the sole system processor). PLD 1010 may also be used as an arbiter for arbitrating access to a shared resource in system 1000. In yet another example, PLD 1010 can be configured as an interface between processor 1040 and one of the other components in system 1000. It should be noted that system 1000 is only exemplary.

In one embodiment, system 1000 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A phase shift circuit comprising:
   a first delay circuit that provides a first delay, wherein the first delay includes a first intrinsic delay and a first intentional delay;
   a delay matching circuit that provides a matching delay, wherein the matching delay matches the first intrinsic delay; and
   a second delay circuit to provide a second delay, wherein the second delay include a second intrinsic delay and second intentional delay, wherein the second intrinsic delay matches the first intrinsic delay and the second intentional delay is half as long as the first intentional delay.

2. The phase shift circuit of claim 1 further comprising:
   a control circuit that controls the first delay circuit based on the first delay and the matching delay.

3. The phase shift circuit of claim 2, wherein the control circuit controls the second delay circuit based on the first delay and the matching delay.

4. The phase shift circuit of claim 2 further comprising:
   a phase detector coupled to the first delay circuit, the delay matching circuit, and the control circuit, wherein the phase detector detects a phase difference between outputs of the first delay circuit and the matching delay circuit, and provides information regarding the phase difference to the control circuit.

5. The phase shift circuit of claim 3, wherein the first delay circuit comprises:
   a first delay chain, wherein the first delay chain receives an input signal and produces a first plurality of output signals, where the first plurality of output signals are delayed versions of the input signal;
   a first selector coupled to the first delay chain, wherein the first selector selects one output signal of the first plurality of output signals, further wherein the first selector has a first selector intrinsic delay;
   a second delay chain, wherein the second delay chain receives the one output signal and produces a second plurality of output signals, where the second plurality of output signals are delayed versions of the one output signal; and
   a second selector coupled to the second delay chain, wherein the second selector selects one output signal of the second plurality of output signals, further wherein the second selector has a second selector intrinsic delay;
   wherein the first intrinsic delay includes the first selector intrinsic delay and the second selector intrinsic delay.

6. The phase shift circuit of claim 5, wherein the second delay circuit comprises:
   a third selector coupled to the first delay chain, wherein the third selector select an output signal of the first plurality of output signals;
   a half unit delay element coupled to the third selector; and
   a fourth selector coupled to the third selector and the half unit delay element.

7. The phase shift circuit of claim 6 further comprising:
   an inverter couple to the first delay circuit, wherein the inverter inverts the one output signal of the second plurality of output signal.

8. The phase shift circuit of claim 7 further comprising:
   a first buffer coupled to the matching delay circuit; and
   a second buffer coupled to the fourth selector;
   wherein an output of the first buffer is a reference signal, an output of the second buffer is a second delayed signal, the input signal has a duty cycle of 50 percent, the one output signal of the second plurality of output signals is phase shifted by 180 degrees with respect to the reference signal, an output of the inverter is in phase with the reference signal, and the second delayed signal is phase shifted by 90 degrees with respect to the reference signal.

9. A two times clock generator including the phase shift circuit of claim 1.

10. A programmable logic device including the phase shift circuit of claim 1.

11. A digital system comprising a programmable logic device including the phase shift circuit of claim 1.

12. A method of producing a phase shifted signal, the method comprising:
   delaying an input signal by a first delay to provide a first delayed signal, wherein the first delay includes a first intrinsic delay and a first intentional delay;
   matching the first intrinsic delay to provide a reference signal, wherein the matching includes delaying the input signal by a delay that matches the first intrinsic delay, and wherein, relative to the reference signal, the first delayed signal is delayed by the first intentional delay; and
   delaying the input signal by a second delay to provide a second delayed signal, wherein the second delay includes a second intrinsic delay and a second intentional delay, the second intrinsic delay matches the first intrinsic delay, the second intentional delay is half of the first intentional delay, and the second delayed signal is delayed by half of the first intentional delay with respect to the reference signal.

13. The method of claim 12, wherein delaying the input signal by the first delay comprises;
   producing a first plurality of delayed input signals;
   selecting on delayed input signal of the first plurality of delayed input signals;
   producing second plurality of second delayed input signals, wherein the second plurality of second input signals are delayed versions of the one delayed input signal; and
   selecting on delay d input signal of the second plurality of input signals.

14. The method of claim 13, wherein matching the first intrinsic delay comprises:
   delaying the input signal using a matching delay selector.

15. The method of claim 13, wherein delaying the input signal by the second delay comprises:
  selecting a delay input signal of the first plurality of delayed input signal;
  adding a half unit delay to the delayed input signal of the first plurality of delayed input signals to provide an added delay signal; and
  selecting between the added delayed signal and the delayed input signal of the first plurality of delayed input signals.

16. The method of claim 15 further comprising:
  inverting the first delayed signal to provide an inverted first delayed signal; and
  detecting a phase difference between the inverted first delayed signal and the reference signal.

17. The method of claim 16, wherein the input signal has a duty cycle of 50 percent, the first delayed signal is phase shifted by 180 degrees with respect to the reference signal, the inverted first delayed signal is in phase with the reference signal, and delaying the input signal by the second delay results in phase shifting the input signal by 90 degrees with respect to the reference signal.

18. A phase shift circuit comprising:
  a first delay chain, wherein the first delay chain receives an input signal and produces a first plurality of output signals the that are delayed versions of the input signal;
  a first selector coupled to the first delay chain, wherein the first selector selects on output signal of the first plurality of output signals, the one output signal of the first plurality of output signals has a first delay relative to the input signal, and the first selector has a first selector intrinsic delay;
  a second delay chain, wherein the second delay chain receives the one output signal and produces a second plurality of output signals that are delayed versions of the one output signal;
  a second selector coupled to the second delay chain, wherein the second selector selects one output signal of the second plurality of output signals, the one output signal of the second plurality of output signals has a second delay relative to the input signal, and the second selector has a second selector intrinsic delay;
  a matching delay circuit to match a combination of the first selector intrinsic delay and the second selector intrinsic delay;
  an inverter coupled to the second selector for inverting the one output signal of the second plurality of output signals;
  a phase detector coupled to the matching delay circuit and the inverter; and
  a control circuit coupled to the phase detector, the first selector, and the second selector.

19. The phase shift circuit of claim 18 further comprising:
  a thirds selector coupled to the first delay chain, wherein the third selector selects an output signal from the first plurality of output signals;
  a half unit delay element coupled to the third selector, wherein the half unit delay element delays the output signal to provide an added delay output signal; and
  a fourth selector coupled to the third selector and the half unit delay element, wherein the fourth selector selects between the output signal and the added delay output signal,
  wherein the control circuit is coupled to the third selector and the fourth selector.

20. The phase shift circuit of claim 19, wherein the matching delay circuit comprises:
  a first matching delay selector; and
  a second matching delay selector;
  wherein the first matching delay selector matches the first selector intrinsic delay and the second matching delay selector matches the second selector intrinsic delay.

21. The phase shift circuit of claim 20 further comprising:
  a first buffer coupled to the matching delay circuit; and
  a second buffer coupled to the fourth selector;
  wherein an output of the first buffer is a reference signal, an output of the second buffer is a second delayed signal, the input signal has a duty cycle of 50 percent, the one output signal of the second plurality of output signals is phase shifted by 180 degrees with respect to the reference signal, an output of the inverter is in phase with the reference signal, and the second delayed signal is phase shifted by 90 degrees with respect to the reference signal.

22. A two times clock generator including the phase shift circuit of claim 18.

23. A programmable logic device including the phase shift circuit of claim 18.

24. A digital system comprising a programmable logic device including the phase shift circuit of claim 18.

* * * * *